United States Patent
Shoda et al.

(10) Patent No.: US 9,762,022 B2
(45) Date of Patent: Sep. 12, 2017

(54) MULTI WAVELENGTH LASER DEVICE

(71) Applicant: Mitsubishi Electric Corporation, Tokyo (JP)

(72) Inventors: Fumio Shoda, Tokyo (JP); Takayuki Yanagisawa, Tokyo (JP); Yosuke Akino, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/036,193

(22) PCT Filed: Dec. 5, 2013

(86) PCT No.: PCT/JP2013/007151
§ 371 (c)(1),
(2) Date: May 12, 2016

(87) PCT Pub. No.: WO2015/083200
PCT Pub. Date: Jun. 11, 2015

(65) Prior Publication Data
US 2016/0276799 A1    Sep. 22, 2016

(51) Int. Cl.
*H01S 3/109* (2006.01)
*G02F 1/37* (2006.01)
(Continued)

(52) U.S. Cl.
CPC ............... *H01S 3/109* (2013.01); *G02F 1/37* (2013.01); *H01S 3/08009* (2013.01);
(Continued)

(58) Field of Classification Search
CPC .. H01S 3/109; H01S 3/08086; H01S 3/08054; H01S 3/08009; H01S 3/094096; H01S 5/141; H01S 5/4087; G02F 1/37
See application file for complete search history.

(56) References Cited

U.S. PATENT DOCUMENTS 5,836,073 A * 11/1998 Mizuuchi ............. G02F 1/3558
29/600
2003/0206336 A1    11/2003 Onaka et al.
(Continued)

FOREIGN PATENT DOCUMENTS

EP    0 625 811 A1    11/1994
EP    0 738 031 A2    10/1996
(Continued)

OTHER PUBLICATIONS

International Search Report—PCT/JP2013/007151 dated Jan. 7, 2014.
(Continued)

*Primary Examiner* — Dung Nguyen
(74) *Attorney, Agent, or Firm* — Studebaker & Brackett PC

(57) ABSTRACT

The multi wavelength laser device includes a laser light source 10 that emits a plurality of laser lights 20 whose fundamental wavelengths differ from one another, a dispersing element 30 that changes the traveling direction of each of the plurality of laser lights according to the wavelength and the incidence direction, and that emits the laser lights in a state in which the laser lights are superposed on the same axis, and a wavelength conversion element 40 that has a plurality of polarization layers disposed therein and having different periods, and that performs wavelength conversion on the fundamental wave laser lights emitted from the dispersing element 30 and placed in the state in which the laser lights are superposed on the same axis, and emits a plurality of laser lights 50 acquired through the wavelength conversion in a state in which the laser lights are superposed on the same axis.

10 Claims, 5 Drawing Sheets

(51) Int. Cl.
*H01S 5/14* (2006.01)
*H01S 3/08* (2006.01)
*H01S 3/094* (2006.01)
*G02F 1/35* (2006.01)
*H01S 5/40* (2006.01)

(52) U.S. Cl.
CPC ...... *H01S 3/08054* (2013.01); *H01S 3/08086* (2013.01); *H01S 3/094096* (2013.01); *H01S 5/141* (2013.01); *G02F 2001/3503* (2013.01); *G02F 2201/305* (2013.01); *G02F 2201/307* (2013.01); *H01S 5/143* (2013.01); *H01S 5/4087* (2013.01)

(56) References Cited

U.S. PATENT DOCUMENTS

| | | |
|---|---|---|
| 2004/0027648 A1 | 2/2004 | Furukawa et al. |
| 2006/0291862 A1 | 12/2006 | Kawai |
| 2007/0121685 A1 | 5/2007 | Maekawa |
| 2008/0095202 A1 | 4/2008 | Yanagisawa et al. |
| 2010/0002732 A1 | 1/2010 | Tidemand-Lichtenberg |
| 2010/0073658 A1 | 3/2010 | Kawai |
| 2013/0208746 A1 | 8/2013 | Jensen et al. |
| 2013/0215916 A1 | 8/2013 | Kakizaki et al. |

FOREIGN PATENT DOCUMENTS

| | | | |
|---|---|---|---|
| JP | 07-170009 | A | 7/1995 |
| JP | 2000-047276 | A | 2/2000 |
| JP | 2002-270933 | A | 9/2002 |
| JP | 2003-324227 | * | 11/2003 |
| JP | 2003-324227 | A | 11/2003 |
| JP | 2004-070338 | A | 3/2004 |
| JP | 2013-044764 | A | 3/2013 |
| JP | 2013-062484 | A | 4/2013 |
| WO | 2005/085947 | A1 | 9/2005 |
| WO | 2006/103767 | A1 | 10/2006 |

OTHER PUBLICATIONS

The extended European search report issued by the European Patent Office on Jun. 27, 2017, which corresponds to European Patent Application No. 13898567.6-1556 and is related to U.S. Appl. No. 15/036,193.

* cited by examiner

MULTI WAVELENGTH LASER DEVICE

FIELD OF THE INVENTION

Generally, the present invention relates to a laser technique. More particularly, it relates to a laser device that can generate a plurality of laser lights having different wavelengths.

BACKGROUND OF THE INVENTION

For example, in display devices that display a color image, which are represented by projectors and projection TVs, light sources of, for example, three colors R (red), G (green) and B (blue) are needed as light sources.

In recent years, as these light sources, there has been proposed a laser device of wavelength conversion type that provides, as fundamental waves, laser lights whose fundamental wavelengths fall within a 900 nm band, a 1 μm band or a 1.3 μm band, respectively (the fundamental waves are referred to as fundamental wave laser lights from here on), and that performs wavelength conversion on these fundamental waves laser lights by using a nonlinear material to cause second harmonic generation (SHG), thereby generating lights having needed colors (wavelengths).

As an example of such a conventional laser device, there is a laser device which is comprised of a semiconductor laser, a laser medium and a nonlinear material. (Patent Reference 1)

A laser device disclosed in patent reference 1 includes a semiconductor laser, a laser medium and a non-linear optical material as components associated with generation of a laser light, as shown in FIG. 1 in patent reference 1.

The semiconductor laser element generates a pumping light for the laser medium. The generated pumping light is absorbed by the laser medium, and a gain for amplifying a fundamental wave laser light is generated in the laser medium.

In addition, by virtue of the generated gain, laser oscillation occurs at a fundamental wavelength in the laser medium and a fundamental wave laser light is emitted. The fundamental wave laser light emitted from the laser medium is converted into a light which is a second harmonic wave through the wavelength conversion in the non-linear optical material.

RELATED ART DOCUMENT

Patent Reference

Patent reference 1: WO 2006/103767

SUMMARY OF THE INVENTION

Problems to be Solved by the Invention

Particularly in the case in which in such a conventional laser device a fundamental wave laser light is generated by using a solid state component as a laser medium (in the case of a so-called solid state laser), the wavelength spectrum width of the fundamental wave laser light becomes very narrow in many cases, and therefore the width of the wavelength spectrum of a light acquired through wavelength conversion also becomes very narrow.

This means that the coherency of the light after wavelength conversion is high, and the laser light provides various merits.

On the other hand, it means that the interference becomes strong, and it is known that there arises a problem that when such a conventional laser device is used for a display device, speckle noise occurs.

As a method of reducing speckle noise, there has been proposed, for example, a method of reducing the coherency of a light source by superposing lights having a plurality of wavelengths.

FIG. 9 is a diagram showing an example of the schematic structure of a multi wavelength laser device in the case of applying a conventional technology.

For the sake of clarity of explanation, FIG. 9 shows an example of using wavelength conversion like that disclosed in above-mentioned patent reference 1, and generating three types of laser lights after wavelength conversion from two fundamental wave laser lights having different wavelengths by using second harmonic generation and sum frequency generation.

In the diagram, 200a and 200b denote laser light sources for fundamental waves, 300a and 300b denote fundamental wave laser lights, 400, . . . , and 407 denote mirrors (including half mirrors), 500a, 500b and 500ab denote wavelength conversion elements, and 600a, 600b and 600ab denote laser lights acquired through wavelength conversion. Further, the direction of each arrow corresponds to the traveling direction of a light.

The fundamental wave laser light 300a emitted from the laser light source 200a is branched by the mirror 400. One of lights into which the fundamental wave laser light 300a is branched is incident upon the wavelength conversion element 500a and the other light is incident upon the wavelength conversion element 500ab via the mirrors 401 and 402.

Similarly, the fundamental wave laser light 300b emitted from the laser light source 200b is branched by the mirror 403. One of lights into which the fundamental wave laser light 300b is branched is incident upon the wavelength conversion element 500b and the other light is incident upon the wavelength conversion element 500ab via the mirror 402.

The wavelength conversion element 500a performs wavelength conversion on the fundamental wave laser light 300a incident thereupon and emits the laser light 600a which is a second harmonic wave. Further, the wavelength conversion element 500b performs wavelength conversion on the fundamental wave laser light 300b incident thereupon and emits the laser light 600b which is a second harmonic wave. Further, the wavelength conversion element 500ab emits the laser light 600ab which is a sum frequency wave from the fundamental wave laser lights 300a and 300b incident thereupon.

The laser light 600a which is a second harmonic wave and the laser light 600ab which is a sum frequency wave are superposed by the mirrors 404 and 405, and those lights and the laser light 600b which is a second harmonic wave are further superposed by the mirrors 406 and 407.

As mentioned above, in the example of the structure shown in FIG. 9, the two fundamental wave laser lights 20a and 20b are generated, wavelength conversion is performed on the generated fundamental wave laser lights by the wavelength conversion element, and the laser lights 600a, 600b and 600b acquired through the wavelength conversion are superposed by the plurality of mirrors and are emitted.

In the above-mentioned multi wavelength laser device shown in FIG. 9, the fundamental wave laser lights must be incident upon the plurality of wavelength conversion elements by using a plurality of mirrors, and the laser lights after the wavelength conversion emitted from the wavelength conversion elements must be combined on the same axis by using a plurality of mirrors.

Therefore, a problem is that the structure of the device becomes complicated.

On the other hand, when the difference between the wavelengths of lights is small, it is difficult to define or limit the traveling direction of each light having a wavelength by using the spectral characteristics of coating of mirrors.

Although in such a case, a method of performing superimposing by using lights having different polarizations can be considered, there arises a problem that it is difficult to superpose a large number of lights having different polarizations.

The present invention is made in order to solve the above-mentioned problems, and it is therefore an object of the present invention to provide a multi wavelength laser device that can provide a plurality of lights after wavelength conversion which are superposed on the same axis with a simple structure, and that can ease restrictions imposed on the lights which are superposed.

Means for Solving the Problem

In accordance with the present invention, there is provided a multi wavelength laser device including: a laser light source to emit a plurality of laser lights whose fundamental wavelengths differ from one another; a dispersing element to change the traveling direction of each of the above-mentioned plurality of laser lights emitted from the above-mentioned laser light source according to the wavelength and the incidence direction, and to emit the above-mentioned plurality of laser lights in a state in which the above-mentioned plurality of laser lights are superposed on the same axis; and a wavelength conversion element to have a plurality of polarization layers disposed therein, the plurality of polarization layers including a polarization inverted regions and a polarization non-inverted regions having different periods, and to perform wavelength conversion, in the above-mentioned polarization layers having different periods, on the above-mentioned plurality of laser lights emitted from the above-mentioned dispersing element and placed in the state in which the above-mentioned plurality of laser lights are superposed on the above-mentioned same axis, and emits a plurality of laser lights which are acquired through the above-mentioned wavelength conversion and whose wavelengths differ from one another in a state in which the above-mentioned plurality of laser lights are superposed on the same axis.

Further, in accordance with the present invention, there is provided another multi wavelength laser device including: a pumping light source that emits a plurality of pumping lights for providing gains for laser media; the laser media that have respective end portions on a side of the above-mentioned pumping light source, the end portions allowing the above-mentioned pumping lights to pass therethrough and reflecting a laser light having a fundamental wavelength, and perform optical amplification by using the above-mentioned plurality of pumping lights emitted from the above-mentioned pumping light source and emit a plurality of laser lights whose fundamental wavelengths differ from one another; a dispersing element that changes the traveling direction of each of the above-mentioned plurality of laser lights emitted from the above-mentioned laser media according to the wavelength and the incidence direction, and that emits the above-mentioned plurality of laser lights in a state in which the above-mentioned plurality of laser lights are superposed on the same axis; a wavelength conversion element that has a polarization inverted region and a polarization non-inverted region which are formed periodically, and that performs wavelength conversion, in the above-mentioned polarization inverted region and the above-mentioned polarization non-inverted region, on the above-mentioned plurality of laser lights emitted from the above-mentioned dispersing element and placed in the state in which the above-mentioned plurality of laser lights are superposed on the above-mentioned same axis, and emits a plurality of laser lights acquired through the above-mentioned wavelength conversion in a state in which the above-mentioned plurality of laser lights are superposed on the same axis; and a mirror that constructs resonators for the above-mentioned plurality of laser lights whose fundamental wavelengths differ from one another, together with the above-mentioned end portions of the above-mentioned laser media on the side of the above-mentioned pumping light source, and that allows the plurality of laser light emitted from the above-mentioned wavelength conversion element and acquired through the above-mentioned wavelength conversion to pass therethrough, and reflects the above-mentioned plurality of laser lights whose fundamental wavelengths differ from one another.

Advantages of the Invention

The multi wavelength laser devices according to the present invention can provide a plurality of lights after wavelength conversion which are superposed on the same axis with a simple structure, and can ease restrictions imposed on the lights which are superposed.

EMBODIMENTS OF THE INVENTION

Figure 1:
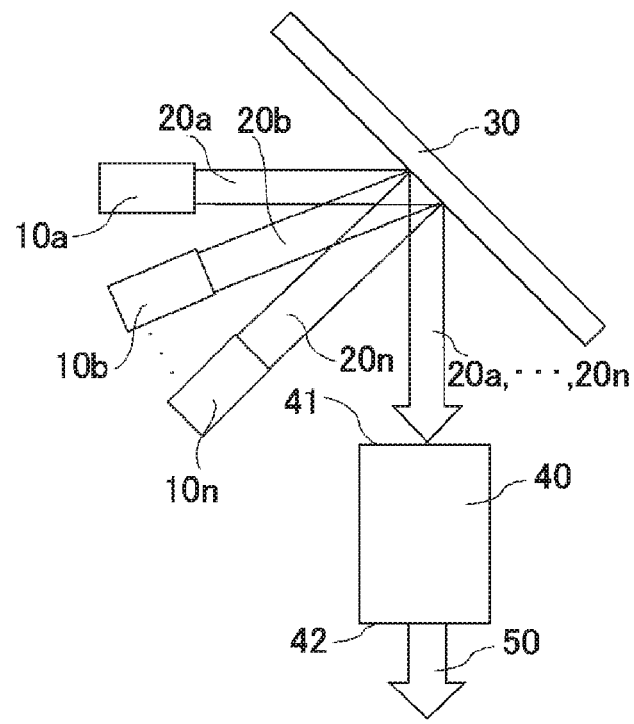
FIG. 1 is a diagram showing an example of the schematic structure of a multi wavelength laser device according to Embodiment 1 of the present invention.

Hereafter, each embodiment of the present invention will be explained by using drawings.

In diagrams of each embodiment explained below, the same components or like components are designated by the same reference numerals or like reference numerals, and there is a case in which a part of an explanation of components is omitted in an explanation of each embodiment.

Further, each component in each diagram is a one after division for convenience in order to explain the present invention, an implementation example of the component is not limited to a structure, the division, a name, etc. shown in the diagram. Further, how the division is performed is not limited to the division shown in the diagram.

Embodiment 1

Hereafter, each Embodiment 1 of the present invention will be explained by using FIGS. 1 to 5.

FIG. 1 is a diagram showing the schematic structure of a multi wavelength laser device in accordance with Embodiment 1 of the present invention.

In the diagram, 10 (10a, . . . , and 10n) denotes a laser light source, 20 (20a, . . . , and 20n) denotes a fundamental wave laser light, 30 denotes a dispersing element, 40 denotes a wavelength conversion element, and 50 denotes a laser light acquired through wavelength conversion. Further, the direction of each arrow shows the traveling direction of a light.

This Embodiment 1 is an example of using a so-called external wavelength conversion method, i.e., a structure in which a wavelength conversion element is placed outside a resonator structure for laser oscillation.

In the following explanation, when pointing out all of the laser light sources or when not making a distinction among the laser light sources, an explanation is made by using the reference numeral 10 in some cases, and when pointing out each laser light source or when making a distinction among the laser light sources, an explanation is made by using the reference character strings 10a to 10n in some cases. An explanation is made similarly as to the fundamental wave laser lights 20 (20a, . . . , and 20n) in some cases.

Further, because the laser light 50 acquired through the wavelength conversion depends on a combination of a plurality of laser lights which are generated by the wavelength conversion element, the laser light 50 represents all of the plurality of laser lights acquired through the wavelength conversion and no distinction is made among the laser lights acquired through the wavelength conversion.

The laser light sources 10 emit a plurality of laser lights whose fundamental wavelengths differ from one another, i.e., fundamental wave laser lights 20a to 20n.

In this embodiment, each of the laser light sources 10a, 10b, . . . , and 10n has a resonator structure for laser oscillation therein. Further, it is assumed that the laser lights 20a, 20b, . . . , and 20n emitted from the laser light sources 10a, 10b, and 10n laser-oscillate with corresponding fundamental wavelengths λa, λb, . . . , and λn.

Further, this embodiment is an example in which the laser light sources 10a, 10b, . . . , and 10n are arranged respectively at different positions or emit the laser lights from different positions respectively.

In addition, this embodiment is an example in which the laser lights emitted from the laser light sources 10a, 10b, and 10n are incident directly upon the dispersing element 30. Therefore, the end portions of the laser light sources 10a, 10b, . . . , and 10n from which these light sources emit the laser lights are oriented in such a way that the laser lights are incident upon the dispersing element 30.

Any laser can be applied, as the laser light sources 10, to this embodiment irrespective of its type. For example, (1) a semiconductor laser or (2) a solid state laser can be applied.

For example, in the case of a semiconductor laser, a semiconductor laser that has a plurality of active layers and performs multi-emitter oscillation in such a way as to be able to emit a plurality of laser lights in an array form can be applied.

Further, for example, in the case of a solid state laser, (1) a solid state laser of bulk type or (2) a solid state laser of waveguide type can be applied.

The dispersing element 30 changes the traveling direction of each of the plurality of laser lights 20a, 20b, . . . , and 20n incident thereupon from the laser light sources 10 according to the wavelength and the incidence direction.

Further, the dispersing element 30 is placed in a position and an orientation which cause the incidence areas, on the dispersing element 30, of the plurality of laser light 20a, 20b, . . . , and 20n emitted from the laser light sources 10 to overlap one another.

Further, the dispersing element 30 is placed in such a way as to emit the plurality of laser lights 20a, 20b, . . . , and 20n incident thereupon in a state in which the plurality of laser lights are superposed on the same axis.

This Embodiment 1 is an example of using, as the dispersing element 30, a diffraction grating that can change the direction in which light incident thereupon travels, dependently upon the wavelength of the light.

In the case of using a diffraction grating as the dispersing element 30, it is desirable to use, for example, a blazed diffraction grating having high diffraction efficiency for a specific order and a specific wavelength.

Further, as to the order of the diffraction grating which will be described below, because the lower order of the diffraction grating is used, the higher diffraction efficiency is acquired, it is desirable to form the diffraction grating into a shape and a size which enable the diffraction grating to be used with a lower order.

The orientations and the arrangement of the laser light sources 10 can be adjusted in such a way that the incidence areas of the fundamental wave laser lights 20a, 20b, . . . , and 20n on the dispersing element 30 overlap one another.

In this embodiment, the case of using a blazed grating will be explained as an example. The details of the blazed grating will be described below.

Further, the shape, the size and the arrangement of the dispersing element 30 are defined in such a way that the laser lights 20a, 20b, . . . , and 20n emitted from the laser light sources 10 are reflected by the dispersing element 30, and the reflected fundamental wave laser lights 20a, 20b, . . . , and 20n are incident upon the wavelength conversion element 40 in a state in which the reflected fundamental wave laser lights are superposed on substantially the same axis.

The wavelength conversion element 40 performs wavelength conversion on the fundamental wave laser lights 20a, 20b, . . . , and 20n incident thereupon, and emits a laser light 50 acquired through the wavelength conversion.

In an explanation of the operation of this embodiment, the case in which the wavelength conversion element performs wavelength conversion by using at least one of second harmonic generation and sum frequency generation, and emits a laser light 50 acquired through the wavelength conversion will be mainly explained as an example.

Although the following explanation will be made by using generic diagrams in which the number (n) of fundamental wave laser lights 20 and the number of laser lights emitted, as the laser light 50, in the state in which the laser lights are superposed on the same axis are not limited particularly, this embodiment can also be applied to even a case of a combination of specific numbers, e.g., a case in which each of them is 2.

Further, a surface 41 of an end portion of the wavelength conversion element 40 is oriented in such a way that the laser lights 20a, 20b, . . . , and 20n reflected by the dispersing element 30 and placed in the state in which the laser lights are superposed are incident thereupon.

Further, on the surface 41 of the end portion of the wavelength conversion element 40, an optical film is formed in such a way as to allow the laser lights 20a, 20b, . . . , and 20n having the fundamental wavelengths to pass therethrough and reflect the laser light 50 acquired through the wavelength conversion.

Further, on a surface 42 of another end portion of the wavelength conversion element 40, an optical film is formed in such a way as to allow the laser light 50 acquired through the wavelength conversion to pass therethrough. The optical film on the surface 42 of the other end portion can be a one that reflects the fundamental wave laser lights 20a, 20b, . . . , and 20n, or a one that allows the fundamental wave laser lights to pass therethrough.

Each of these optical films 41 and 42 can be formed by laminating, for example, dielectric thin films.

As a material of the wavelength conversion element 40, a conventional or new wavelength conversion material can be used. For example, KTP, KN, BBO, LBO, CLBO, LiNbO3 or LiTaO3 can be used as the conventional material.

The details of the wavelength conversion element 40 will be described below.

Next, the blazed grating used as the dispersing element 30 will be explained.

Figure 2:
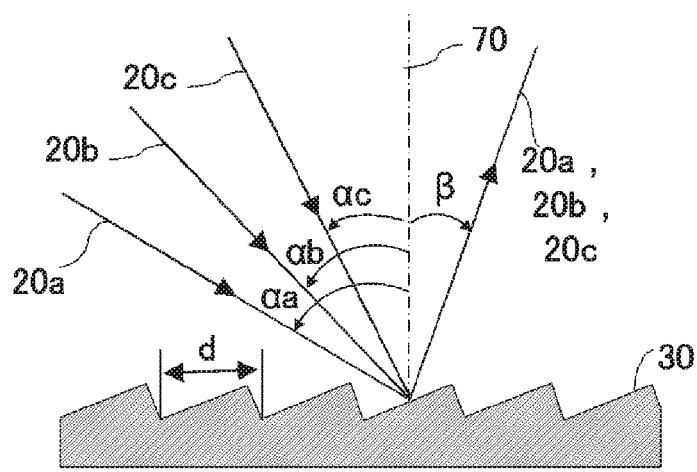
FIG. 2 is a diagram showing the principle of the operation of a diffraction grating according to Embodiment 1 of the present invention.

FIG. 2 is a diagram showing the principle behind the operation of the blazed grating.

A detailed explanation of the same components and the same reference character strings as those shown in FIG. 1 will be omitted hereafter.

In the diagram, 70 denotes the normal to a surface on which the diffraction grating is formed, $\alpha$ ($\alpha a$, $\alpha b$, $\alpha c$) denotes the angle of incidence of each fundamental wave laser light 20 (20a, 20b, 20c) which is defined with respect to the normal 70 to the diffraction grating, $\beta$ denotes the angle of emergence of each fundamental wave laser light 20 (20a, 20b, 20c) which is defined with respect to the normal 70 to the diffraction grating, d denotes the pitch of the diffraction grating, and each arrow shows the traveling direction of a light.

In the diagram, a cross section of the diffraction grating 30 is shown, and the grating is formed on the surface shown in an upper side of the diagram.

Further, in the diagram, for the sake of clarity, the case in which the number of fundamental wave laser lights 20 is 3 is shown as an example. However, the number of fundamental wave laser lights can be another number, and it can be assumed that the fundamental wave laser lights 20a, 20b, . . . , and 20n are provided, like in the case of FIG. 1.

Further, for the sake of clarity of the angles, each arrow is illustrated as a thin arrow, unlike in the case of FIG. 1.

The angle of emergence of a light emitted from the dispersing element 30 depends upon the angle of incidence of the light incident upon the dispersing element 30, the pitch of the diffraction grating of the dispersing element 30, and the wavelength of the incident light, and is shown by the following grating equation in the case of the blazed grating.

$$\sin \alpha + \sin \beta = Nm\lambda \quad (1)$$

In this equation, $\alpha$ denotes the angle of incidence of the light, $\beta$ denotes the angle of emergence of the light, $\lambda$ denotes the wavelength of the light, m denotes the order, and N denotes the number of slits of the grating per mm (the number of grooves). The number N of slits (the number of grooves) is defined as the reciprocal of the width d of the aperture (the diffraction grating period).

The values of the angles $\alpha$ and $\beta$ are defined with respect to the normal to the surface on which the diffraction grating is formed. In the diagram, each angle shown by a counterclockwise arrow has a positive value.

On the basis of the equation (1), the angles of incidence $\alpha a$, $\alpha b$ and $\alpha c$ of the three fundamental wave laser lights 20a, 20b and 20c incident upon the diffraction grating 30 are determined and the plurality of laser light sources 10 and the diffraction grating 30 are arranged in such a way that the angles of emergence $\beta$ of the fundamental wave laser light 20a, 20b and 20c become equal to one another.

By doing in this way, the plurality of fundamental wave laser lights 20a, 20b and 20c having the different wavelengths, which are emitted from the laser light sources 10, can be emitted at the same angle of emergence $\beta$.

By arranging the laser light sources in such a way that the incidence areas of the fundamental wave laser lights 20a, 20b and 20c overlap one another, the fundamental wave laser lights 20a, 20b and 20c can be emitted from the diffraction grating 30 in the state in which the fundamental wave laser lights are superposed on the same axis.

Next, the details of the wavelength conversion element 40 and the principle behind the operation of the wavelength conversion element will be explained.

The plurality of laser lights having the fundamental wavelengths placed in the state in which the laser lights are superposed on the same axis are incident upon the wavelength conversion element 40 from the dispersing element 30. The wavelength conversion element 40 performs wavelength conversion on the laser lights incident thereupon, and outputs a plurality of laser lights 50 acquired through the wavelength conversion from the surface 42 of the end portion.

In this embodiment, an example of using a QPM (Quasi-Phase Matching) wavelength conversion element as the wavelength conversion element 40 will be explained.

Figure 3:
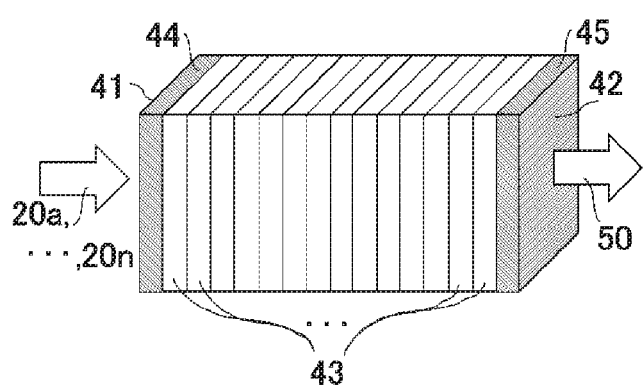
FIG. 3 is a perspective view showing an example of the schematic structure and the operation of a wavelength conversion element according to Embodiment 1 of the present invention.

FIG. 3 is a perspective view showing an example of the schematic structure and the operation of the QPM wavelength conversion element 40.

In the view, 43 denotes a polarization inverted layer, and 44 and 45 denote optical films.

A detailed explanation of the same components as those shown in FIGS. 1 and 2 will be omitted hereafter.

As shown in the diagram, the wavelength conversion element 40 has a plurality of polarization inverted layers 43.

Each polarization inverted layer 43 is a one in which the direction of the dielectric polarization of a dielectric material polarized in a certain direction is inverted.

Within the wavelength conversion element 40, polarization non-inverted regions and polarization inverted regions are arranged alternately as the polarization inverted layers 43, and a single crystal is provided as the whole of the polarization inverted layers 43.

As a result, within the wavelength conversion element 40, the polarization inverted layers 43 are formed periodically.

The plurality of fundamental wave laser lights 20a, 20b, . . . , and 20n whose fundamental wavelengths differ from one another are incident upon the wavelength conversion element 40 from the surface 41 of the end portion while the fundamental wave laser lights are in the state in which they are superposed on the same axis.

In this case, the axes of the fundamental wave laser lights $20a$, $20b$, ..., and $20n$ placed in the state in which they are superposed do not necessarily have to be aligned with the optical axis or the crystallographic axis of the wavelength conversion element 40. The axes of the fundamental wave laser lights can be made to be not aligned with the optical axis or the crystallographic axis of the wavelength conversion element, dependently upon, for example, (1) a combination of the wavelengths of the laser lights $20a$ $20b$, ..., and $20n$, (2) the structure of the element, or (3) the wavelength conversion method.

The fundamental wave laser light $20a$, $20b$, ..., and $20n$ incident upon the wavelength conversion element 40 propagate through the polarization non-inverted regions and the polarization inverted regions which are arranged alternately, in order, and then propagate up to the surface 42 of the other end portion.

Figure 4:
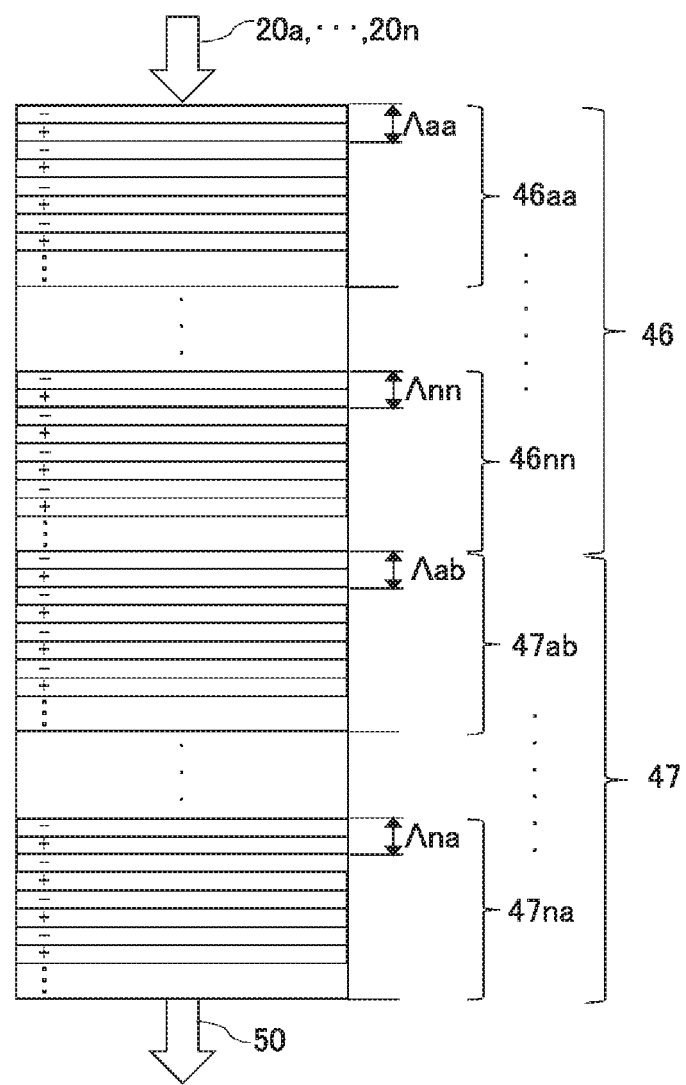
FIG. 4 is a diagram showing an example of the internal structure of the wavelength conversion element according to Embodiment 1 of the present invention.

FIG. 4 is a diagram showing an example of the internal structure of the QPM wavelength conversion grating shown in FIG. 3.

A detailed explanation of the same components as those shown in each of the above-mentioned diagrams will be omitted hereafter.

In the diagram, a pattern of the polarization inversion when viewed from a side of the wavelength conversion element 40 shown in FIG. 3 is shown.

FIG. 4 shows a generic case in which the wavelength conversion on all the lights having the fundamental wavelengths $\lambda a$, ..., and $\lambda n$ is enabled.

In the diagram, 46 ($46aa$, ..., $46nn$) denotes a second harmonic generation region, 47 ($47ab$, ..., $47na$) denotes a sum frequency generation region, $\Lambda$ ($\Lambda aa$, ..., $\Lambda nn$, $\Lambda ab$, ..., $\Lambda na$) denotes the period of each generation region 46 ($46aa$, ..., $46nn$, $47ab$, ..., $47na$), and positive (+) sign and negative (−) sign denote directions of dielectric polarization.

Further, subscripts a, b, ..., and n in the reference character strings which denote the regions correspond to subscripts a, b, ..., and n in the reference character strings $20a$, $20b$, ..., and $20n$ which denote the fundamental wave laser lights 20, respectively. Therefore, while in the case of each second harmonic generation region 46, the same subscripts are used in the reference character string, in the case of each sum frequency generation region 47, different subscripts are used in the reference character string.

Further, as shown in the diagram, the wavelength conversion element is configured in such a way that a plurality of sets of polarization layers each of which consists of a polarization layer (a polarization non-inverted region) denoted by positive (+) and a polarization layer (a polarization inverted region) denoted by negative (−) are arranged along the optical axis direction.

The period $\Lambda$ ($\Lambda aa$, ..., $\Lambda nn$, $\Lambda ab$, ..., $\Lambda na$) of each set of a polarization non-inverted region and a polarization inverted region, which are mentioned above, is determined according to the wavelengths of the incident fundamental wave laser lights 20 and the wavelengths of the laser lights 50 acquired through the wavelength conversion when the wavelength conversion element 40 is formed.

Parameters, such as the angle of the crystallographic axis, operating temperatures and the period, are determined when the wavelength conversion element 40 is formed in such a way that in the second harmonic generation region $46aa$ the light having the fundamental wavelength $\lambda a$ is converted into a second harmonic wave having a wavelength $\lambda a/2$.

By similarly forming another second harmonic generation region $46bb$ (, ..., $46nn$), the light having the fundamental wavelength $\lambda b$ (, ..., $\lambda n$) can be converted into a second harmonic wave having a wavelength $\lambda b/2$ (, ..., $\lambda n/2$).

In addition, parameters, such as the angle of the crystallographic axis, operating temperatures and the period, are determined in such a way that in the sum frequency generation region $47ab$ the light having the fundamental wavelength $\lambda a$ and the light having the fundamental wavelength $\lambda b$ can be converted into a sum frequency wave light having a wavelength $\lambda ab$ ($=(\lambda a \cdot \lambda b)/(\lambda a + \lambda b)$).

Because the same goes for the other sum frequency generation regions, an explanation of the other sum frequency generation regions will be omitted hereafter.

As mentioned above, in the case in which it is desired to generate a second harmonic wave for the light having the fundamental wavelength $\lambda a$, the region having the period $\Lambda aa$ corresponding to the wavelength $\lambda a$ is formed, in the case in which it is desired to generate a second harmonic wave for the light having the fundamental wavelength $\lambda b$, the region having the period $\Lambda b$ corresponding to the wavelength $\lambda b$ is formed, ..., and in the case in which it is desired to generate a second harmonic wave for the light having the fundamental wavelength $\lambda n$, the region having the period $\Lambda n$ corresponding to the wavelength $\lambda n$ is formed.

Similarly, in the case of generating a sum frequency wave of the wavelength $\lambda a$ and the wavelength $\lambda b$, the region having the period $\Lambda ab$ corresponding to the wavelengths $\lambda a$ and $\lambda b$ is formed, in the case of generating a sum frequency wave of the wavelength $\lambda b$ and the wavelength $\lambda c$, the region having the period $\Lambda bc$ corresponding to the wavelengths $\lambda b$ and $\lambda c$ is formed, ..., and in the case of generating a sum frequency wave of the wavelength $\lambda n$ and the wavelength $\lambda a$, the region having the period $\Lambda na$ corresponding to the wavelengths $\lambda n$ and $\lambda a$ is formed.

There will be considered a case in which, for example, the fundamental wave laser light $20a$ having the wavelength $\lambda a$ and the fundamental wave laser light $20b$ having the wavelength $\lambda b$ are incident upon the wavelength conversion element (the QPM wavelength conversion element) 40 configured as above. When the fundamental wave laser light $20a$ having the wavelength $\lambda a$ is incident, a part of the fundamental wave laser light $20a$ having the wavelength $\lambda a$ is wavelength-converted, in the second harmonic generation region $46aa$ for the wavelength $\lambda a$, into a laser light which is a second harmonic wave having the wavelength $\lambda a/2$ by virtue of the nonlinear optical effect.

Similarly, when the fundamental wave laser light $20b$ having the wavelength $\lambda b$ is incident, a part of the fundamental wave laser light $20b$ having the wavelength $\lambda b$ is wavelength-converted, in the second harmonic generation region $46bb$ corresponding to the wavelength, into a laser light $20b$ which is a second harmonic wave.

Then, apart of the fundamental wave laser lights $20a$ and $20b$ which have not been converted, in the region $46aa$ having the period $\Lambda aa$ and in the region $46bb$ having the period $\Lambda bb$, into the laser lights which are second harmonic waves, is converted, in the sum frequency generation region $47ab$ corresponding to both the wavelengths of the fundamental wave laser lights, into a laser light which is a sum frequency wave having a wavelength $\lambda ab$ ($=\lambda a \cdot \lambda b/(\lambda a + \lambda b)$) by virtue of the nonlinear optical effect.

Similarly in the case in which a fundamental wave laser light having another wavelength is incident, the fundamental wave laser light is similarly converted into a laser light which is a second harmonic wave by disposing a corresponding second harmonic generation region. Further, by disposing regions (regions having the period Λbc, . . . , and the period Λna) 47 for conversion into sum frequency waves for other combinations of fundamental wave laser lights, in each of the regions a part of fundamental wave laser lights having corresponding wavelengths is converted into a laser light which is a sum frequency wave.

In the case in which an optical film for reflecting the fundamental wave laser lights is formed on the end surface 42, the fundamental wave laser lights 20 which are incident upon the wavelength conversion element 40, but are not wavelength-converted are total-reflected by the end surface 42, and propagates through the wavelength conversion element 40 again, and a part of the fundamental wave laser lights is converted into laser lights which are second harmonic waves and laser lights which are sum frequency waves.

On the other hand, some of the laser lights which are acquired through the wavelength conversion and each of which is a second harmonic wave or a sum frequency wave are emitted directly to outside the wavelength conversion element 40 from the end surface 42 while the remaining laser lights are emitted to outside the element from the end surface 42 after total-reflected by the end surface 41.

The laser lights acquired through the wavelength conversion are the ones 50 placed in the state in which the plurality of laser lights are superposed on the same axis.

As mentioned above, the multi wavelength laser device according to this embodiment can provide a plurality of laser lights after wavelength conversion which are superposed on the same axis with a simple structure, and can ease restrictions imposed on the lights which are superposed.

Further, because a plurality of wavelength conversion regions are disposed in the single wavelength conversion element, the multi wavelength laser device can reduce the loss of the laser lights 20 having the fundamental wavelengths in each of the conversion regions, and can achieve good wavelength conversion efficiency.

Although the explanation is made as to the embodiment of the present invention by using the example in which the multi wavelength laser device has the structure shown in FIG. 1, the multi wavelength laser device can have a structure other than the structure shown in FIG. 1.

Further, although it is desirable that as the state in which laser lights are superposed on the same axis, which is explained in the embodiment of the invention, all of the cross sections and the traveling directions of the laser lights match one another, they do not have to completely match one another, and it is preferable that the laser lights are superposed to such an extent that the advantages of the present invention are provided, or to such an extent that the superposition meets the performance required for, for example, a display device using the laser device according to the present invention.

Further, although the example in which a diffraction grating of reflection type is used as the dispersing element 30 is explained in this embodiment, the configuration of the dispersing element 30 is not limited to this example. For example, a dispersing prism which will be described below can be alternatively used. Also in this case, if the dispersing element 30 and the laser light sources 10 are arranged in such a way that the laser lights incident from the plurality of laser light sources 10 are made to be incident upon the wavelength conversion element 40 in a state in which the plurality of fundamental wave laser lights are superposed on substantially the same axis, the same functions as those according to this embodiment can be provided.

Further, as the material of the wavelength conversion element 40, MgO-doped LiNbO3, MgO-doped LiTaO3, stoichiometric LiNbO3, or stoichiometric LiTaO3, which is resistant to optical damage, can be used.

In this case, because the power densities of the fundamental wave laser lights 20 incident upon the wavelength conversion element 40 can be improved, higher efficient wavelength conversion can be carried out.

As an alternative, MgO-doped LiNbO3, MgO-doped LiTaO3, stoichiometric LiNbO3, stoichiometric LiTaO3, or KTP, which has a periodically polarization-inverted structure, can be used as the material of the wavelength conversion element 40. In this case, because its nonlinear constant is large, wavelength conversion having higher efficiency than that in the case of MgO-doped LiNbO3 or the like can be carried out.

Embodiment 2

Hereafter, each Embodiment 2 of the present invention will be explained by using FIG. 5.

An explanation of the same components as those of the structure shown in FIG. 2 according to above-mentioned Embodiment 1, or like components will be omitted in some cases.

Figure 5:
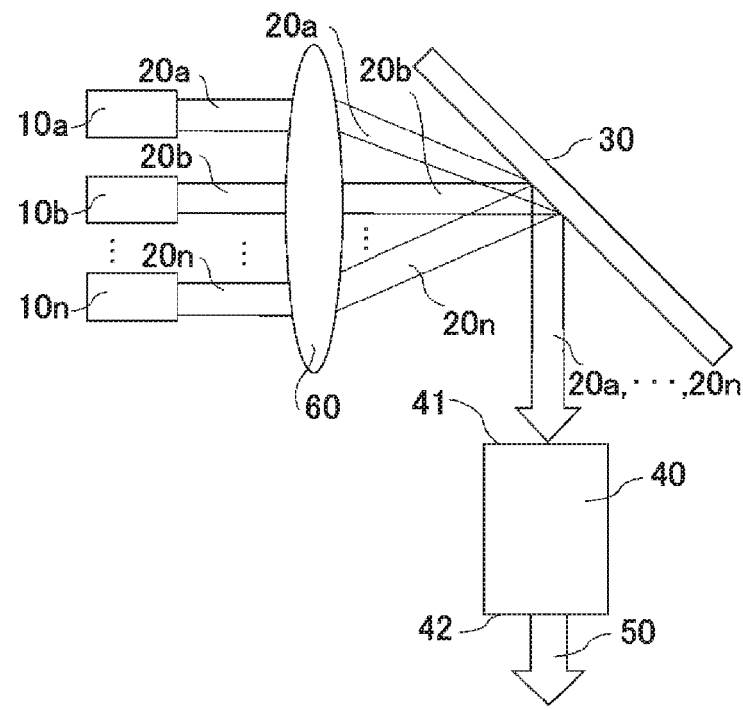
FIG. 5 is a diagram showing an example of the schematic structure of a multi wavelength laser device according to Embodiment 2 of the present invention.

FIG. 5 is a diagram showing an example of the schematic structure of a multi wavelength laser device according to Embodiment 2 of the present invention.

In the diagram, 60 denotes a lens.

The laser device according to this embodiment differs from that according to above-mentioned Embodiment 1 in that the lens 60 is added between laser light sources 10 and a dispersing element 30, and laser light emission sides of the laser light sources 10 are oriented toward the lens 60, in the laser device shown in FIG. 1 according to Embodiment 1.

The lens 60 emits a plurality of laser lights 20*a*, 20*b*, . . . , and 20*n* which are incident thereupon from the laser light sources 10 and whose fundamental wavelengths differ from one another toward the same region on the dispersing element 30.

The laser light sources 10*a*, 10*b*, . . . , and 10*n*, the lens 60 and the dispersing element 30 are arranged in such a way that the angles of emergence $\beta$ of the laser lights 20*a*, 20*b*, . . . , and 20*n* incident upon the dispersing element 30 are equal to one another and satisfy the above-mentioned equation (1), like in the case of above-mentioned Embodiment 1.

It is desirable that the distances between the laser light emitting positions of the laser light sources 10*a*, 10*b*, . . . , and 10*n* and the lens 60 are set to be equal to the focal distance of the lens 60.

Because the positions at which the laser lights 20*a*, 20*b*, . . . , and 20*n* are incident upon the lens 60 differ from one another because of the above-mentioned structure, the angles at which the laser lights are incident upon the dispersing element 30 differ from one another because of the eccentricity of the lens 20.

The laser lights 20*a*, 20*b*, . . . , and 20*n* focused by the lens 60 are incident upon the dispersing element 30 in such a way that the laser lights overlap one another in the same region on the dispersing element 30.

The focused laser lights 20*a*, 20*b*, . . . , and 20*n* are emitted from the dispersing element 30 toward the wavelength conversion element 40 in a state in which the laser lights are superposed on the same axis.

As mentioned above, the multi wavelength laser device according to this embodiment provides the same advantages as those provided by Embodiment 1.

Further, although it is desirable that as the state in which the laser lights overlap one another in the same region, which is explained in the embodiment of the invention, all of the overlapping regions in the same region on the dispersing element 30 match one another, they do not have to completely match one another, and it is preferable that the laser lights overlap one another to such an extent that the advantages of the present invention are provided, or to such an extent that the overlapping meets the performance required for, for example, a display device using the laser device according to the present invention.

Further, although the single lens 60 is used in this embodiment, this embodiment is not limited to the structure shown in the diagram. For example, (1) lenses are arranged for either the laser light sources 10a, 10b, . . . , and 10n or the laser lights 20a, 20b, . . . , and 20n, respectively, or (2) lenses are used for some of the laser light sources or the laser lights, respectively.

Embodiment 3

Hereafter, each Embodiment 3 of the present invention will be explained by using FIG. 6.

An explanation of the same components as those of the structure according to each of the above-mentioned embodiments, or like components will be omitted in some cases.

Figure 6:
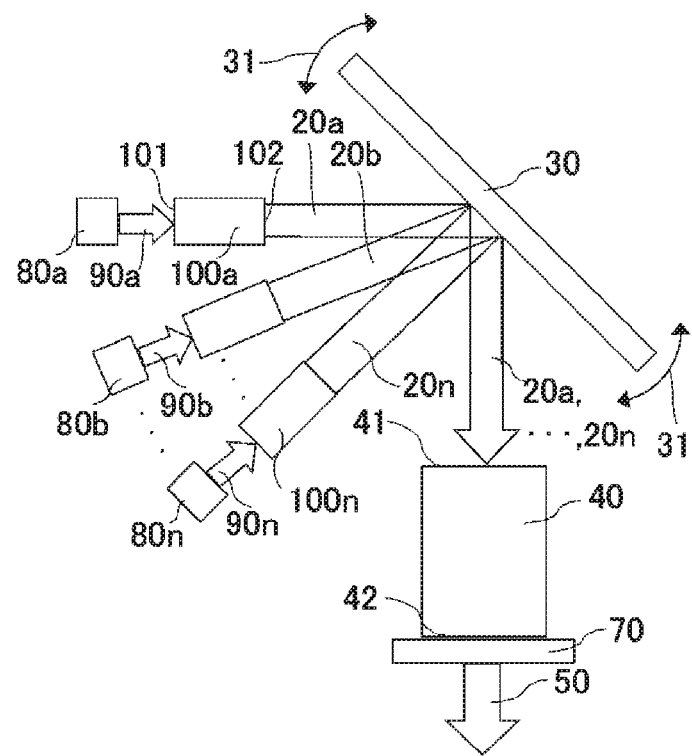
FIG. 6 is a diagram showing an example of the schematic structure of a multi wavelength laser device according to Embodiment 3 of the present invention.

FIG. 6 is a diagram showing an example of the schematic structure of a multi wavelength laser device according to Embodiment 3 of the present invention.

In the diagram, 31 denotes an angle adjustment mechanism, 70 denotes a mirror, 80 (80a, 80b, . . . , and 80n) denotes a semiconductor laser, 90 (90a, 90b, . . . , and 90n) denotes a pumping light, and 100 (100a, 100b, . . . , and 100n) denotes a laser medium.

In the following explanation, when pointing out all of the semiconductor lasers or when not making a distinction among the laser light sources, an explanation is made by using the reference numeral 80 in some cases, and when pointing out each laser light source or when making a distinction among the laser light sources, an explanation is made by using the reference character strings 80a to 80n in some cases, like in the case of Embodiment 1. An explanation is made similarly as to the pumping lights 90 in some cases.

The laser device according to this embodiment greatly differs from that according to above-mentioned Embodiment 1 in that the laser light sources 10 shown in FIG. 1 are replaced by the semiconductor lasers 80 and the laser media 100, and the semiconductor lasers and the laser media are arranged, and in that that the mirror 70 is added to an output side of a wavelength conversion element 40 via which laser lights 50 are outputted.

Accordingly, this embodiment is an example in which the laser device uses an internal wavelength conversion method, i.e., has a structure in which a wavelength conversion element is placed inside resonators, instead of using an external wavelength conversion method as shown in Embodiment 1 and Embodiment 2, i.e., having a structure in which a wavelength conversion element is placed outside resonators.

The semiconductor lasers 80 are pumping light sources that emit the plurality of pumping lights 90 for pumping the laser media 100.

More specifically, the semiconductor lasers 80 emit the pumping lights 90 which the laser media 100 need to generate their respective gains for optical amplification. The wavelengths of the pumping lights 90a, 90b . . . , and 90n are predetermined according to the laser media 100a, 100b, . . . , and 100n, and the wavelengths, the powers, etc. of the laser lights 20a, 20b, . . . , and 20n which are emitted from the laser media.

Further, the semiconductor lasers 80 are disposed in such a way that their end portions via which the semiconductor lasers emit the pumping lights 90 are opposite to surfaces 101 of end portions of the laser media 100.

A laser that consists of, for example, a compound semiconductor material can be used as each of the semiconductor lasers 80.

The pumping lights 90 emitted from the pumping light sources 80 are incident upon the laser media 100. Further, the laser media 100 emit a plurality of laser lights 20a, 20b, . . . , and 20n whose fundamental wavelengths differ from one another.

Further, the laser medium 100a has the surface 101 of the end portion thereof for allowing the pumping light 90a to pass therethrough and reflecting the fundamental wave laser light 20a on a side of the pumping light source. The surface 101 of the end portion constructs a part of a resonator structure for oscillating the laser light 20a having a fundamental wavelength.

Similarly, each of the other laser media 100b, . . . , and 100n has the surface 101 for allowing the pumping light to pass therethrough and allowing the fundamental wave laser light to pass therethrough.

As a material of each of the laser media 100, a conventional or new laser medium can be used. For example, Nd:YAG, Nd:YLF, Nd:Glass, Nd:YVO4, Nd:GdVO4, Yb:YAG, Yb:YLF, Yb:KGW, Er:Glass, Er:YAG, Tm:YAG, Tm:YLF, Ho:YAG, Ho:YLF, Ti:Sapphire or Cr:LiSAF can be used.

A surface 42 of an end portion of the wavelength conversion element 40 has a characteristic of allowing the lights having fundamental wavelengths to pass therethrough.

The mirror 70 has a characteristic of reflecting the fundamental wave laser lights 20 and allowing laser lights 50 acquired through the wavelength conversion to pass therethrough.

Further, the mirror 70 constructs a part of resonators for oscillating the laser lights 20 having the fundamental wavelengths together with the surfaces 101 of the end portions of the laser media.

Next, the operation of the laser device will be explained.

Hereafter, for the sake of clarity of explanation, a case of performing wavelength conversion by using two fundamental wave laser lights having different fundamental wavelengths $\lambda a$ and $\lambda b$, and generating a laser light which is a second harmonic wave of each of the fundamental wave laser lights and a laser light which is a sum frequency wave of both the fundamental wave laser lights will be explained as an example. However, the number of laser lights can be another number and is not limited.

An explanation will be made by assuming that the wavelength at which the amplification gain peaks is $\lambda a$ in the laser medium 100a and the wavelength at which the amplification gain peaks is $\lambda b$ in the laser medium 100b, and the laser media laser-oscillate at their respective wavelengths.

First, the pumping light 90a for pumping the laser medium 100a is emitted from the semiconductor laser 80a.

When the pumping light 90a is incident upon the laser medium 100a, a population inversion state of electrons is produced within the laser medium 100*a* and the laser medium then enters a mode in which spontaneous emission light resonates, and the spontaneous emission light is amplified by induced emission.

This light goes and comes back within the resonator which consists of the surface 101 of the end portion of the laser medium 100*a* and the mirror 70.

At that time, when the amplification gain provided to the light during the time period that the light makes a round trip in the resonator exceeds the loss which the light receives during the time period that the light makes a round trip in the resonator, the light having the wavelength λa laser-oscillates and the fundamental wave laser light 20*a* is emitted from the laser medium 100*a*.

Similarly, a light having the wavelength λb laser-oscillates by virtue of the semiconductor laser 80*b*, the laser medium 100*b* and the mirror 70, and the fundamental wave laser light 20*b* is emitted from the laser medium 100*b*.

The fundamental wave laser light 20*a* emitted from the laser medium 100*a* and the fundamental wave laser light 20*b* emitted from the laser medium 100*b* are incident upon the dispersing element 30 at angles of incidence αa and αb (refer to FIG. 2) which satisfy the equation (1) with respect to the wavelengths λa and λb.

The angles of emergence β of the fundamental wave laser lights 20*a* and 20*b* emitted from the dispersing element 30 are equal to each other, so that the fundamental wave laser lights are emitted in a state in which the fundamental wave laser lights are superposed on the same axis.

In the wavelength conversion element 40, periodically polarization inverted layers are formed in advance in such a way that with respect to the lights having the fundamental wavelengths λa and λb, a second harmonic wave (having a wavelength=λa/2) for the wavelength λa, a second harmonic wave (having a wavelength=λb/2) for the wavelength λb, and a sum frequency wave (having a wavelength λab= (λa·λb)/(λa+λb)) for the wavelengths λa and λb are generated (refer to FIG. 4).

When the fundamental wave laser light 20*a* having the wavelength λa is incident upon the wavelength conversion element 40, apart of the fundamental wave laser light 20*a* having the wavelength λa is wavelength-converted into a second harmonic light having the wavelength λa/2 in a second harmonic generation region 46*aa* for the wavelength λa (a region having a period Λaa).

Similarly, on the fundamental wave laser light 20*b* having the wavelength λb, conversion into a laser light having the wavelength λb/2 is carried out in a region (a region having a period Λbb) 46*bb* in which the light having the wavelength λb is converted into a second harmonic wave.

Further, in a sum frequency generation region (a region having a period Λab) 47*ab*, the fundamental wave laser lights having the wavelengths λa and λb are converted into a sum frequency wave light having a wavelength λab (=λa·λb/(λa+λb)).

The above-mentioned laser lights each of which is a second harmonic wave or a sum frequency wave generated in the wavelength conversion element 40 are emitted to outside the wavelength conversion element via the surface 42 of the end portion of the wavelength conversion element 40 and the mirror 70.

At that time, the laser lights acquired through the wavelength conversion are emitted from the wavelength conversion element 40 as laser lights 50 in the state in which the plurality of laser lights are superposed on the same axis.

In this way, the fundamental wave laser lights (20*a* and 20*b*) having the wavelengths λa and λb are incident upon the wavelength conversion element 40 in the state in which the fundamental wave laser lights are superposed on the same axis and the incident laser lights propagate through polarization non-inverted regions and polarization inverted regions in order, so that wavelength conversion is carried out on the incident laser lights and the three laser lights having the wavelengths λa/2, λb/2 and λab are generated.

These three laser lights are emitted to outside the laser device from the mirror 70 via the end surface 42 of the wavelength conversion element 40.

Fundamental laser lights 20*a* and 20*b* each of which has been incident from the dispersing element 30, but has been converted into neither a light which is a second harmonic wave nor a light which is a sum frequency wave in the wavelength conversion element 40 are reflected by the mirror 70 via the end surface 42, and are incident upon the wavelength conversion element 40 again and a part of the fundamental wave laser lights is converted into a light which is a second harmonic wave and a light which is a sum frequency wave when passing through the polarization non-inverted regions and the polarization inverted regions, like in the above-mentioned case.

The lights each of which is a second harmonic wave or a sum frequency wave generated at that time are reflected by the end surface 41 of the wavelength conversion element 40, and are emitted to outside the laser device from the mirror 70 via the end surface 42.

On the other hand, fundamental wave laser lights 20*a* and 20*b* which have been reflected by the mirror 70 and incident upon the wavelength conversion element 40 again, but have not been wavelength-converted propagate up to the surfaces 101 of the end portions of the laser media 100*a* and 100*b* corresponding to their respective wavelengths, i.e., parts of the resonators and are then reflected by the parts, and contribute to the operations of causing the fundamental wave laser lights to laser-oscillate, like in the above-mentioned case.

As mentioned above, the multi wavelength laser device according to this embodiment provides the same advantages as those provided by Embodiment 1.

Further, because the laser device adopts the internal wavelength conversion method, the laser device can perform the wavelength conversion more efficiently as compared with the case, as shown in Embodiment 1 and Embodiment 2, in which the wavelength conversion of the fundamental waves is carried out outside the resonators.

In the present embodiment, the case in which the laser media 100 and the dispersing element 30 are constructed in such a way that each laser medium 100 laser-oscillates at its fundamental wavelength which is the wavelength at which the gain of the laser medium peaks, and the angles of emergence β of the lights reflected by the dispersing element 30 are equal to one another at the wavelengths at each of which the gain peaks is explained.

Referring to the above-mentioned equation (1), it is seen that when the gain band of each laser medium 100 according to this embodiment is wide, the fundamental wavelength at which each laser medium laser-oscillates can be changed because the wavelength satisfying the equation (1) is varied by varying the angle of the dispersing element 30.

Therefore, the plurality of laser media 12 can be rearranged while the angles of incidence of the laser lights incident upon the dispersing element 30 from the plurality of laser media 12 are varied, or there can be provided an angle adjustment mechanism 31 that can adjust the angles of incidence of the laser lights 20 incident upon the dispersing element 30 (refer to FIG. 6, but no detailed structure of the angle adjustment mechanism is illustrated).

In the case in which the angle adjustment mechanism 31 is disposed, because the angle of incidence α of each light incident upon the dispersing element 30 varies, the wavelengths of the fundamental wave laser light 20a and 20b vary from the wavelengths λa and λb, which are the wavelengths at which the gains of the laser media 100a and 100b peak, to wavelengths λa+Δλa and λb+Δλb, respectively. In this case, Δλa and Δλb show wavelength variations.

In the wavelength conversion element 40, by predetermining parameters, such as the angle of the crystallographic axis, temperatures, and periods of polarization inversion, and disposing a polarization structure in such a way that wavelength conversion is carried out also on lights having the fundamental wavelengths λa+Δλa and λb+Δλb, the wavelengths of the laser lights acquired through the wavelength conversion can be varied and the laser lights can be emitted in the state in which the laser lights are superimposed on the same axis.

Embodiment 4

Hereafter, each Embodiment 4 of the present invention will be explained by using FIG. 7.

An explanation of the same components as those of the structure according to each of the above-mentioned embodiments, or like components will be omitted in some cases.

Figure 7:
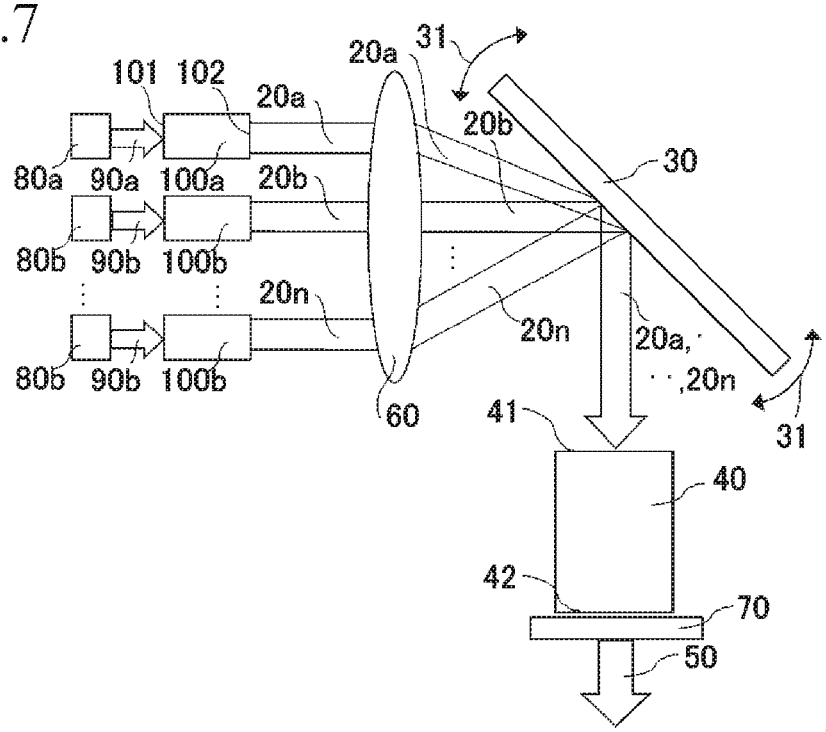
FIG. 7 is a diagram showing an example of the schematic structure of a multi wavelength laser device according to Embodiment 4 of the present invention.

FIG. 7 is a diagram showing an example of the schematic structure of a multi wavelength laser device according to Embodiment 4 of the present invention.

The multi wavelength laser device according to this embodiment differs from that shown in FIG. 6 according to above-mentioned Embodiment 3 in that a lens 60 is added between laser media 100 and a dispersing element 30, and sides of the laser media 100 from which the laser media emit fundamental wave laser lights are oriented toward the lens 60.

The lens 60 changes the traveling directions of the fundamental wave laser lights $20a, 20b, \ldots,$ and $20n$ emitted from the laser media 100 and emit the fundamental wave laser lights toward the same region on the dispersing element 30.

The laser media $100a, 100b, \ldots,$ and $100n$, the lens 60 and the dispersing element 30 are arranged in such a way that the angles of emergence β of the fundamental wave laser lights $20a, 20b, \ldots,$ and $20n$ incident upon the dispersing element 30 are equal to one another and satisfy the above-mentioned equation (1), like in the case of above-mentioned Embodiment 2.

It is desirable that the distances between the emitting positions of the fundamental wave laser lights from the laser light sources $100a, 100b, \ldots,$ and $100n$ and the lens 60 are set to be equal to the focal distance of the lens 60.

As mentioned above, the multi wavelength laser device according to this embodiment provides the same advantages as those provided by Embodiment 1.

Further, by performing wavelength conversion on the fundamental waves within resonators, like in the case of Embodiment 3, the laser device can perform the wavelength conversion more efficiently as compared with the case, as shown in Embodiment 1 and Embodiment 2, in which the wavelength conversion of the fundamental waves is carried out outside the resonators.

Further, because the laser device includes an angle adjustment mechanism 31, the wavelengths of laser lights after the wavelength conversion can be varied and the laser lights can be emitted in a state in which the laser lights are superimposed on the same axis, like in the case of including the angle adjustment mechanism 31 in Embodiment 3.

Embodiment 5

Hereafter, each Embodiment 5 of the present invention will be explained by using FIG. 8.

An explanation of the same components as those of the structure shown in FIG. 2 according to above-mentioned Embodiment 1, or like components will be omitted in some cases.

Figure 8:
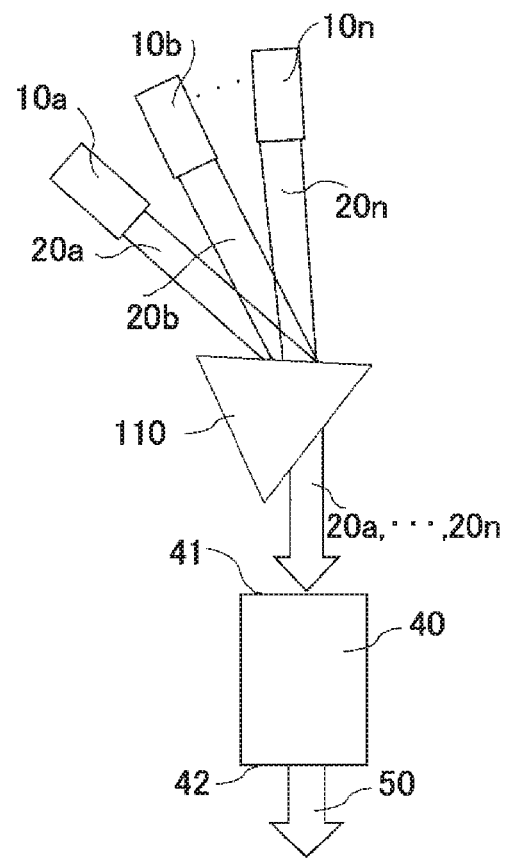
FIG. 8 is a diagram showing an example of the schematic structure of a multi wavelength laser device according to Embodiment 5 of the present invention.
Figure 9:
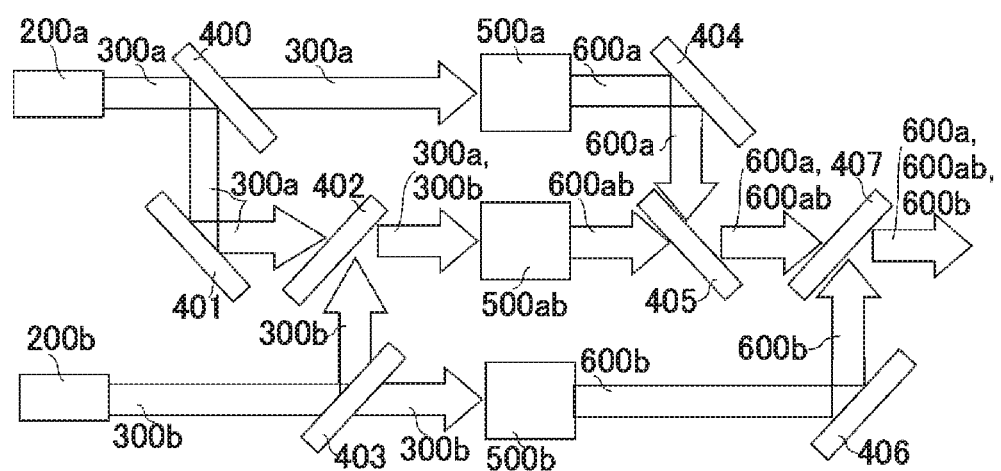
FIG. 9 is a diagram showing an example of the schematic structure of a multi wavelength laser device in the case of applying a conventional technology.

FIG. 8 is a diagram showing an example of the schematic structure of a multi wavelength laser device according to Embodiment 5 of the present invention.

In the diagram, 110 denotes a dispersing prism.

The laser device according to this embodiment differs from each of above-mentioned embodiments in that as a dispersing element 30, the dispersing prism 110 is used instead of a diffraction grating.

While in the case of the diffraction grating 30 according to above-mentioned Embodiment 1 the traveling direction of each laser light 20 incident upon the diffraction grating is changed when the laser light is reflected, in the case of the dispersing prism 110 the traveling direction of each laser light is changed when the laser light passes through the dispersing prism.

The operation of the multi wavelength laser device is the same, except for the above-mentioned operation.

As mentioned above, the present embodiment provides the same advantages as those provided by Embodiment 1.

A lens 60 for focusing lights can be further used, like in the case of above-mentioned Embodiment 2 and Embodiment 4.

Further, this embodiment can be applied to an internal resonator type structure, like in the case of Embodiment 3 and Embodiment 4, and the present invention is not limited to the present embodiment.

Although the case in which the polarization inverted regions are formed, as the wavelength conversion element 40, in such order as shown in FIG. 4 is explained in each of the above-mentioned embodiments, it is not necessary to provide all of the wavelength conversion regions shown in FIG. 4, and, for example, only wavelength conversion regions corresponding to wavelengths which are desired to be emitted in a state in which corresponding lights are superposed on the same axis can be formed. The same goes for either the laser light sources 10 or the semiconductor lasers 90 and the laser media 100, and it is not necessary to provide all of them.

Further, although the laser device has, as its implementation, (1) all of the structure and the configuration which are shown in each of the above-mentioned diagrams, and (2) the wavelength conversion regions shown in FIG. 4 as the wavelength conversion element 40, various implementation examples, such as an example of disposing only some of the laser light sources 10, but not all, and an example of disposing only some of the semiconductor lasers 90, but not all, and only some of the laser media 100, but not all can be provided.

Further, although the case in which the wavelength conversion element has the structure in which the region having a polarization inversion period Λaa, the region having a polarization inversion period Λbb, . . . , and the region having a polarization inversion period Λnn are arranged in the second harmonic generation regions 46 of the wavelength conversion element 40 in the order shown in the diagram is explained in each of the above-mentioned embodiments, the present invention is not limited to this structure.

For example, the wavelength conversion element can have a structure in which the polarization inversion periods increase or decrease gradually i.e., vary like a so-called chirp along a direction from the end portion 41 to the end portion 42.

As an alternative, the wavelength conversion element can have a structure in which the polarization inversion period varies like a chirp within each of the regions.

By thus causing the periodical structure of polarization inversion to vary like a chirp, the phase matching bandwidth which is the tolerance of the phase matching condition can be widened as compared with the case in which the polarization inversion period is uniform.

The sum frequency generation regions 47 can be similarly made to have a structure in which the periodical structure of polarization inversion is varied like a chirp. In this case, the same advantages can be provided.

Further, although the example in which the wavelength conversion element 40 generates second harmonic waves and sum frequency waves is explained in each of the above-mentioned embodiments, the present invention is not limited to this example.

For example, regions for difference frequency generation or regions for parametric oscillation can be disposed within the wavelength conversion element 40. In this case, the advantages of the present invention can be provided.

Further, in each of the above-mentioned embodiments, after the fundamental wave laser lights 20 emitted from the dispersing element 30 are incident upon the wavelength conversion element 40 in the state in which the fundamental wave laser lights are superposed on the same axis, and the plurality of laser lights acquired through the wavelength conversion are emitted from the wavelength conversion element 40 in the state in which the plurality of laser lights are superposed on the same axis.

However, both "the same axes" mentioned above in the incidence to the wavelength conversion element 40 and in the emission from the wavelength conversion element 40 do not necessarily have to be aligned with each other. For example, according to one of various parameters set at the time of installing the laser device, e.g., a condition of the quasi phase matching for prevention of QPM wavelength conversion which is used for the wavelength conversion element 40, the incident laser lights can be superposed on an axis different from an axis on which the laser lights emitted are superposed.

Further, although the diagram of the multi wavelength laser device shown in each of the above-mentioned embodiments is shown as a diagram in which the detailed structure is omitted for the sake of clarity in explanation, the multi wavelength laser device can include other functional elements or components, e.g., a power supply unit and a controller.

Further, the way in which the multi wavelength laser device according to each of the above-mentioned embodiments is constructed is shown above as an example, the present invention is not limited to the structures shown in the diagrams in implementation of the device. Further, what is necessary is just to be able to implement the equivalent functions and the present invention is not limited to each of the embodiments, and various variants can be provided within the scope of the problems described in the present invention and the advantages provided by the present invention.

EXPLANATIONS OF REFERENCE NUMERALS 10 (10a, 10b, . . . , and 10n) laser light source, 20 (20a, 20b, . . . , and 20n) fundamental wave laser light, 30 dispersing element (diffraction grating or dispersing prism), 31 angle adjustment mechanism, 40 wavelength conversion element, 41 end portion of wavelength conversion element (or surface of end portion), 42 end portion of wavelength conversion element (or surface of end portion), 43 polarization inverted region, 44 and 45 optical film (dielectric thin film), 46 (46aa, . . . , and 46nn) second harmonic generation region, 47 (47ab, . . . , and 47na) sum frequency generation region, 50 laser light having a wavelength after wavelength conversion, 60 lens, 70 mirror, 80 (80a, 80b, . . . , and 80n) semiconductor laser, 90 (90a, 90b, . . . , and 90n) pumping light, 100 (100a, 100b, . . . , and 100n) laser medium, 110 dispersing prism (dispersing element), $\alpha$ angle of incidence, $\beta$ angle of emergence, and d pitch of diffraction grating.

The invention claimed is:
1. A multi wavelength laser device comprising:
a laser light source to emit a plurality of laser lights whose fundamental wavelengths differ from one another;
a dispersing element to change a traveling direction of each of said plurality of laser lights emitted from said laser light source according to a wavelength and an incidence direction, and to emit said plurality of laser lights in a state in which said plurality of laser lights are superposed on same axis; and
a wavelength conversion element including a plurality of polarization layers disposed therein, said plurality of polarization layers including polarization inverted regions and polarization non-inverted regions having different periods, and performing wavelength conversion, in said polarization layers having different periods, on said plurality of laser lights emitted from said dispersing element and placed in the state in which said plurality of laser lights are superposed on said same axis, and emits a plurality of laser lights which are acquired through said wavelength conversion and whose wavelengths differ from one another in the state in which said plurality of laser lights are superposed on same axis, the wavelength conversion element including a structure in which periods of polarization inversion of said plurality of polarization non-inverted regions and said plurality of polarization inverted regions in said plurality of polarization layers increase or decrease gradually and continuously along a direction from an end portion thereof upon which said laser lights having the fundamental wavelengths are incident to an end portion thereof from which said wavelength conversion element emits the laser lights acquired through said wavelength conversion.
2. The multi wavelength laser device according to claim 1, wherein said wavelength conversion element performs said wavelength conversion on the plurality of laser lights emitted from said dispersing element and placed in the state in which the plurality of laser lights are superposed on said same axis by performing wavelength conversion using at least one of second harmonic generation and sum frequency generation in said polarization layers, and emits the plurality of laser lights which are acquired through said wavelength conversion and whose wavelengths differ from one another in the state in which the plurality of laser lights are superposed on the same axis.

3. The multi wavelength laser device according to claim 1, wherein said multi wavelength laser device further comprises an optical lens that is placed between said laser light source and said dispersing element, and that emits said plurality of laser lights which are emitted from said laser light source and whose fundamental wavelengths differ from one another toward same region on said dispersing element.

4. The multi wavelength laser device according to claim 1, wherein said dispersing element has an angle adjustment mechanism that can adjust incidence directions of said plurality of laser lights whose fundamental wavelengths differ from one another.

5. A multi wavelength laser device comprising:
a pumping light source to emit a plurality of pumping lights for providing gains for laser media;
the laser media including respective end portions on a side of said pumping light source, said end portions allowing said pumping lights to pass therethrough and reflecting a laser light having a fundamental wavelength, and to perform optical amplification by using said plurality of pumping lights emitted from said pumping light source and emit a plurality of laser lights whose fundamental wavelengths differ from one another;
a dispersing element to change a traveling direction of each of said plurality of laser lights emitted from said laser media according to a wavelength and an incidence direction, and to emit said plurality of laser lights in a state in which said plurality of laser lights are superposed on same axis;
a wavelength conversion element including a polarization inverted region and a polarization non-inverted region which are formed periodically, and performing wavelength conversion, in said polarization inverted region and said polarization non-inverted region, on said plurality of laser lights emitted from said dispersing element and placed in the state in which said plurality of laser lights are superposed on said same axis, and emits a plurality of laser lights acquired through said wavelength conversion in the state in which said plurality of laser lights are superposed on same axis; and
a mirror to construct resonators for said plurality of laser lights whose fundamental wavelengths differ from one another, together with said end portions of said laser media on the side of said pumping light source, and to allow the plurality of laser lights emitted from said wavelength conversion element and acquired through said wavelength conversion to pass therethrough, and reflects said plurality of laser lights whose fundamental wavelengths differ from one another.

6. The multi wavelength laser device according to claim 5, wherein said wavelength conversion element performs said wavelength conversion on the plurality of laser lights emitted from said dispersing element and placed in the state in which the plurality of laser lights are superposed on said same axis by performing wavelength conversion using at least one of second harmonic generation and sum frequency generation in said polarization layers, and emits the plurality of laser lights which are acquired through said wavelength conversion and whose wavelengths differ from one another in the state in which the plurality of laser lights are superposed on the same axis.

7. The multi wavelength laser device according to claim 5, wherein said multi wavelength laser device further comprises an optical lens that is placed between said laser light source and said dispersing element, and that emits said plurality of laser lights which are emitted from said laser light source and whose fundamental wavelengths differ from one another toward same region of said dispersing element.

8. The multi wavelength laser device according to claim 6, wherein said wavelength conversion element has a structure in which periods of polarization inversion of said plurality of polarization non-inverted regions and said plurality of polarization inverted regions in said plurality of polarization layers increase or decrease gradually and continuously along a direction from an end portion thereof upon which said laser lights having the fundamental wavelengths are incident to an end portion thereof from which said wavelength conversion element emits the laser lights acquired through said wavelength conversion.

9. The multi wavelength laser device according to claim 7, wherein said wavelength conversion element has a structure in which periods of polarization inversion of said plurality of polarization non-inverted regions and said plurality of polarization inverted regions in said plurality of polarization layers increase or decrease gradually and continuously along a direction from an end portion thereof upon which said laser lights having the fundamental wavelengths are incident to an end portion thereof from which said wavelength conversion element emits the laser lights acquired through said wavelength conversion.

10. The multi wavelength laser device according to claim 5, wherein said dispersing element has an angle adjustment mechanism that can adjust incidence directions of said plurality of laser lights whose fundamental wavelengths differ from one another.

* * * * *